(12) United States Patent
Barth et al.

(10) Patent No.: US 6,737,747 B2
(45) Date of Patent: May 18, 2004

(54) ADVANCED BEOL INTERCONNECT STRUCTURES WITH LOW-K PE CVD CAP LAYER AND METHOD THEREOF

(75) Inventors: Edward Barth, Ridgefield, CT (US); John A. Fitzsimmons, Poughkeepsie, NY (US); Stephen M. Gates, Ossining, NY (US); Thomas H. Ivers, Hopewell Junction, NY (US); Sarah L. Lane, Wappingers Falls, NY (US); Jia Lee, Ossining, NY (US); Ann McDonald, New Windsor, NY (US); Vincent McGahay, Poughkeepsie, NY (US); Darryl D. Restaino, Modena, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/047,965

(22) Filed: Jan. 15, 2002

(65) Prior Publication Data

US 2003/0132510 A1 Jul. 17, 2003

(51) Int. Cl.[7] .................... H01L 23/48; H01L 23/58
(52) U.S. Cl. ................ 257/760; 257/637; 257/640; 257/642; 257/759; 257/762
(58) Field of Search ................... 257/635, 637, 257/639–642, 649, 651–653, 758–763, 767, 773, 774; 438/82, 623, 624, 626–629, 630, 631, 637, 639, 640, 643, 644, 645, 653, 654, 687, 724, 725, 744, 757, 769, 791, 927, 954, 780

(56) References Cited

U.S. PATENT DOCUMENTS 5,679,169 A    10/1997    Gonzales et al. ............ 134/1.3
6,071,809 A *  6/2000    Zhao ........................... 438/635
6,080,529 A    6/2000    Ye et al. ...................... 430/318

(List continued on next page.)

FOREIGN PATENT DOCUMENTS

FR           2794286 A1    12/2000
JP           11330023 A    11/1999
WO           WO 99/33102    7/1999

OTHER PUBLICATIONS

Soo Geun Lee et al., "Low Dielectric Constant 3MS a–SiC:H as Cu Diffusion Barrier Layer in Cu Dual Damascene Process," Japanese Journal of Applied Physics, Part 1, vol. 40, No. 4B, pp. 2663–2668, Apr. 2001.

2000 IEEE, A High performance 0.13um Copper BEOL Technology with Low–k Dielectric, R.D. Goldblatt et al., IBM Semiconductor Research and Development Center, Hopewell Junction, NY, Infineon Technologies Inc., pp. 261–263.

Primary Examiner—Hung Vu
(74) Attorney, Agent, or Firm—Margaret A. Pepper

(57) ABSTRACT

An advanced back-end-of-line (BEOL) metallization structure is disclosed. The structure includes a diffusion barrier or cap layer having a low dielectric constant (low-k), where the cap layer is formed of silicon nitride by a plasma-enhanced chemical vapor deposition (PE CVD) process. The metallization structure also includes an inter-layer dielectric (ILD) formed of a carbon-containing dielectric material having a dielectric constant of less than about 4, and a continuous hardmask layer overlying the ILD which is preferably formed of silicon nitride or silicon carbide. A method for forming the BEOL metallization structure is also disclosed. The method includes a pre-clean or pre-activation step to improve the adhesion of the cap layer to the underlying copper conductors. The pre-clean or pre-activation step comprises exposing the copper surface to a reducing plasma including hydrogen, ammonia, nitrogen and/or noble gases.

13 Claims, 5 Drawing Sheets

U.S. PATENT DOCUMENTS

| | | | |
|---|---|---|---|
| 6,150,258 A | 11/2000 | Mountsier et al. | 438/623 |
| 6,153,523 A | 11/2000 | Van Ngo et al. | 438/687 |
| 6,184,128 B1 | 2/2001 | Wang et al. | 438/637 |
| 6,184,572 B1 | 2/2001 | Mountsier et al. | 257/637 |
| 6,187,672 B1 | 2/2001 | Zhao et al. | 438/639 |
| 6,261,951 B1 | 7/2001 | Buchwalter et al. | 438/644 |
| 6,420,261 B2 * | 7/2002 | Kudo | 438/633 |
| 6,424,038 B1 * | 7/2002 | Bao et al. | 257/741 |
| 2001/0002333 A1 | 5/2001 | Huang et al. | 438/637 |
| 2001/0002731 A1 | 6/2001 | Ueda | 257/750 |
| 2001/0003064 A1 | 6/2001 | Ohto | 438/687 |
| 2003/0008493 A1 * | 1/2003 | Lee | 438/626 |

* cited by examiner

US 6,737,747 B2

ADVANCED BEOL INTERCONNECT STRUCTURES WITH LOW-K PE CVD CAP LAYER AND METHOD THEREOF

FIELD OF THE INVENTION

This invention relates generally to the manufacture of high speed semiconductor microprocessors, application specific integrated circuits (ASICs), and other high speed integrated circuit devices. More particularly, this invention relates to advanced back-end-of-line (BEOL) metallization structures for semiconductor devices using low-k dielectric materials. The invention is specifically directed to an advanced BEOL interconnect structure having a low-k cap layer, and a method of forming the interconnect structure using a plasma-enhanced chemical vapor deposition (PE CVD) process to form the cap layer.

BACKGROUND OF THE INVENTION

In semiconductor devices, aluminum and aluminum alloys have been used as the traditional interconnect metallurgies. While aluminum-based metallurgies have been the material of choice for use as metal interconnects over the past years, concern now exists as to whether aluminum will meet the demands required as circuit density and speeds for semiconductor devices increase. Because of these growing concerns, other materials have been investigated as possible replacements for aluminum-based metallurgies.

One highly advantageous material now being considered as a potential replacement for aluminum metallurgies is copper, because of its lower susceptibility to electromigration failure as compared to aluminum, as well as its lower resistivity.

Despite these advantages, copper suffers from an important disadvantage. Copper readily diffuses into the surrounding dielectric material during subsequent processing steps. To inhibit the diffusion of copper, copper interconnects are often capped with a protective barrier layer. One method of capping involves the use of a conductive barrier layer of tantalum, titanium or tungsten, in pure or alloy form, along the sidewalls and bottom of the copper interconnection. To cap the upper surface of the copper interconnection, a dielectric material such as silicon nitride is typically employed.

For example, state-of-the-art dual damascene interconnect structures comprising copper interconnects are described in "A High Performance 0.13 $\mu$m Copper BEOL Technology with Low-k Dielectric," by R. D. Goldblatt et al., Proceedings of the IEEE 2000 International Interconnect Technology Conference, pp. 261–263. A typical interconnect structure using low-k dielectric material and copper interconnects is shown in FIG. 1. The interconnect structure comprises a lower substrate 10 which may contain logic circuit elements such as transistors. A dielectric layer 12, commonly known as an inter-layer dielectric (ILD), overlies the substrate 10. In advanced interconnect structures, ILD layer 12 is preferably a low-k polymeric thermoset material such as SiLK™ (an aromatic hydrocarbon thermosetting polymer available from The Dow Chemical Company). An adhesion promoter layer 11 may be disposed between the substrate 10 and ILD layer 12. A layer of silicon nitride 13 may be disposed on ILD layer 12. Silicon nitride layer 13 is commonly known as a hardmask layer or polish stop layer. At least one conductor 15 is embedded in ILD layer 12. Conductor 15 is typically copper in advanced interconnect structures, but may alternatively be aluminum or other conductive material. A diffusion barrier liner 14 may be disposed between ILD layer 12 and conductor 15. Diffusion barrier liner 14 is typically comprised of tantalum, titanium, tungsten or nitrides of these metals. The top surface of conductor 15 is made coplanar with the top surface of silicon nitride layer 13, usually by a chemical-mechanical polish (CMP) step. A cap layer 17, also typically of silicon nitride, is disposed on conductor 15 and silicon nitride layer 13. Silicon nitride cap layer 17 acts as a diffusion barrier to prevent diffusion of copper from conductor 15 into the surrounding dielectric material.

A first interconnect level is defined by adhesion promoter layer 11, ILD layer 12, silicon nitride layer 13, diffusion barrier liner 14, conductor 15, and cap layer 17 in the interconnect structure shown in FIG. 1. A second interconnect level, shown above the first interconnect level in FIG. 1, includes adhesion promoter layer 18, ILD layer 19, silicon nitride layer 20, diffusion barrier liner 21, conductor 22, and cap layer 24.

The first and second interconnect levels may be formed by conventional damascene processes. For example, formation of the second interconnect level begins with deposition of adhesion promoter layer 18. Next, the ILD material 19 is deposited onto adhesion promoter layer 18. If the ILD material is a low-k polymeric thermoset material such as SiLK™, the ILD material is typically spin-applied, given a post apply hot bake to remove solvent, and cured at elevated temperature. Next, silicon nitride layer 20 is deposited on the ILD. Silicon nitride layer 20, also known as a hardmask layer or polish stop layer, is patterned by conventional photolithography techniques, and then acts as a mask during subsequent etching of ILD layer 19, adhesion promoter layer 18 and cap layer 17, to form at least one trench and via. The trenches and vias are typically lined with diffusion barrier liner 21. The trenches and vias are then filled with a metal such as copper to form conductor 22 in a conventional dual damascene process. Excess metal is removed by a CMP process. Silicon nitride layer 20 acts as a polish stop layer during the CMP process. Finally, silicon nitride cap layer 24 is deposited on copper conductor 22 and silicon nitride layer 20.

Silicon nitride layers 13 and 20 are not necessary components of the finished interconnect structure, because after planarization by CMP, dielectric cap layers 17 and 24 are deposited across copper conductors 15 and 22, and ILD layers 12 and 19. In fact, hardmask or polish stop layers 13 and 20 are often polished away completely in at least some portions of the wafer, prior to dielectric cap layer deposition.

Due to the need for low temperature processing after copper deposition, the cap layers 17 and 24 are typically deposited at temperatures below 450° C. Accordingly, cap layer deposition is typically performed using plasma enhanced chemical vapor deposition (PE CVD) or high density plasma chemical vapor deposition (HDP CVD) wherein the deposition temperature generally ranges from about 200° C. to about 500° C.

PE CVD and HDP CVD silicon nitride have been used for many other applications in semiconductor device manufacturing. However, in using a silicon nitride cap for copper interconnects, conventional PE CVD silicon nitride creates reliability problems. In particular, silicon nitride films deposited using conventional PE CVD processes generally exhibit poor adhesion to the copper surface. For instance, some nitride films delaminate and form blisters over patterned copper lines, particularly during subsequent dielectric depositions, metallization, and chemical-mechanical polishing. After being deposited onto copper metallurgy, additional insulating layers generally will be deposited over the silicon nitride film. However, subsequent deposition of insulating layers onto the nitride film will produce stress which can cause the silicon nitride film to peel from the copper surface. This delamination results in several catastrophic failure mechanisms, including lifting intermetal dielectrics, lifting copper lines, and copper diffusion from uncapped copper lines. Such results are generally seen in dual damascene processing wherein delamination of the silicon nitride hardmask layer generally occurs during copper chemical-mechanical polishing (CMP).

Silicon nitride films deposited using HDP CVD generally exhibit superior adhesion to copper surfaces as compared to PE CVD silicon nitride films. However, HDP CVD silicon nitride films are more costly to produce than PE CVD silicon nitride films. Moreover, significant disadvantages occur when HDP CVD silicon nitride films are used in advanced ground-rule interconnect structures using low-k dielectric materials such as SiLK™. The energetic reactions of the HDP process can enable interaction with and within the low-k dielectric materials causing undesirable changes to occur. These changes can be significantly mitigated by the use of PE CVD silicon nitride films. However, the poor performance of PE CVD films when compared to HDP CVD films—due to the poor adhesion of PE CVD films to copper surfaces—has heretofore precluded the integration of PE CVD films in advanced interconnect structures.

A method to improve the adhesion of PE CVD films is disclosed in U.S. Pat. No. 6,261,951 to Buchwalter et al., titled "Plasma Treatment to Enhance Inorganic Dielectric Adhesion to Copper," the disclosure of which is incorporated herein by reference. In the Buchwalter et al. method, the copper surfaces of an interconnect structure are first exposed to a reducing plasma under conditions such that a new material layer is formed on the copper, wherein the new material layer comprises copper, silicon, oxygen and optionally at least one of carbon, hydrogen, nitrogen and fluorine. The exposure or "pre-clean" step is carried out in a suitable reducing plasma such as hydrogen, nitrogen, ammonia and/or noble gases, at a temperature of about 20° C. to about 600° C., for a time of about 1 to about 3600 seconds. Moreover, the exposure step of the Buchwalter et al. method is conducted at a pressure of about 1 mTorr to about 20 mTorr, at a power of about 50 watts to about 10,000 watts, and at a gas flow rate of about 1 sccm to about 10,000 sccm.

The interconnect structure of Buchwalter et al. does not include a hardmask or polish stop layer. Moreover, Buchwalter et al. contemplate that their pre-clean method may be used in conjunction with various dielectric materials, and silicon dioxide is disclosed to be the preferred dielectric material. However, when the pre-clean method of Buchwalter et al. is used in conjunction with certain low-k dielectric materials such as SiLK™, it has been discovered that the plasma exposure step may severely damage or destroy such low-k dielectric materials. Specifically, it has been observed that SiLK™ dielectric material has been etched away during this pre-clean step at rates of several thousand angstroms per minute.

Thus, there is a need in the art for an advanced interconnect structure comprising low-k dielectric material and a diffusion cap layer formed by PE CVD, where the PE CVD cap layer is in strong adhesive contact with the metal conductor.

There is a further need in the art for an advanced interconnect structure comprising low-k dielectric material and a diffusion cap layer formed by PE CVD, where the low-k dielectric material is protected from damage during pre-clean of the metal conductor and deposition of the cap layer.

SUMMARY OF THE INVENTION

The problems described above are addressed through use of the present invention, which is directed to an interconnect structure formed on a substrate. In one embodiment, the structure comprises: a dielectric layer overlying the substrate, said dielectric layer being formed of a carbon-containing dielectric material having a dielectric constant of less than about 4; a continuous hardmask layer on said dielectric layer, said hardmask layer having a top surface; at least one conductor embedded in said dielectric layer and having a surface coplanar with the top surface of said hardmask layer; and a cap layer on said at least one conductor and on said hardmask layer, said cap layer having a bottom surface in strong adhesive contact with said conductor, wherein said cap layer is formed of silicon nitride by a plasma-enhanced chemical vapor deposition (PE CVD) process.

The present invention is also directed to a method of forming an interconnect structure on a substrate. In one embodiment, the method comprises the steps of: depositing a dielectric layer, said dielectric layer being formed of a carbon-containing dielectric material having a dielectric constant of less than about 4; depositing a hardmask layer on said dielectric layer, said hardmask layer having a top surface; forming an opening in said dielectric layer and said hardmask layer; filling said opening with a conductive material, thereby forming a conductor, said conductor having a surface coplanar with the top surface of said hardmask layer; exposing said conductor to a reducing plasma comprising at least one gas selected from the group consisting of $H_2$, $N_2$, $NH_3$ and noble gases; and depositing silicon nitride on said conductor by a plasma-enhanced chemical vapor deposition (PE CVD) process, thereby forming a silicon nitride cap layer.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION OF THE INVENTION

The invention will now be described by reference to the accompanying figures. In the figures, various aspects of the structures have been shown and schematically represented in a simplified manner to more clearly describe and illustrate the invention. For example, the figures are not intended to be to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

Although certain aspects of the invention will be described with respect to a structure comprising copper, the invention is not so limited. Although copper is the preferred conductive material, the structure of the present invention may comprise any suitable conductive material, such as aluminum.

The invention addresses the difficulties observed in the integration of PE CVD silicon nitride capping films in advanced ground-rule semiconductor devices. The invention enables the use of PE CVD deposited cap layers in advanced device structures without the degradation in device characteristics often encountered with HDP CVD deposited films. The invention involves the use of an independent pre-clean or pre-activation step followed by a PE CVD deposition, preferably in a clustered arrangement in order to prevent deactivation of this pre-cleaned/pre-activated surface and to promote maximum PE CVD film performance in a device structure as measured by electrical characterization. Furthermore, it has been demonstrated that the invention provides for maximum values of adhesion as determined by a four-point bend adhesion testing technique. Using this adhesion test, typical PE CVD silicon nitride films have exhibited adhesion values of about 5 Joules/m$^2$ to less than about 10 Joules/m$^2$, and typical HDP CVD silicon nitride films have exhibited adhesion values of about 20 Joules/m$^2$. In contrast to typical PE CVD and HDP CVD films, the PE CVD silicon nitride structures produced by this invention have measured adhesion values of about 30 Joules/m$^2$.

In addition, since the invention uses a pre-clean step which is compatible to both the device integration and the dielectric materials used to confine and insulate copper structures, the invention is not only useful for device structures using silicon nitride in the construction process, but is also useful for device structures using advanced low-k materials such as silicon carbide and silicon oxycarbide, as well as alloys containing their elements of construction such as N, C, O, Si and H.

Figure 1:
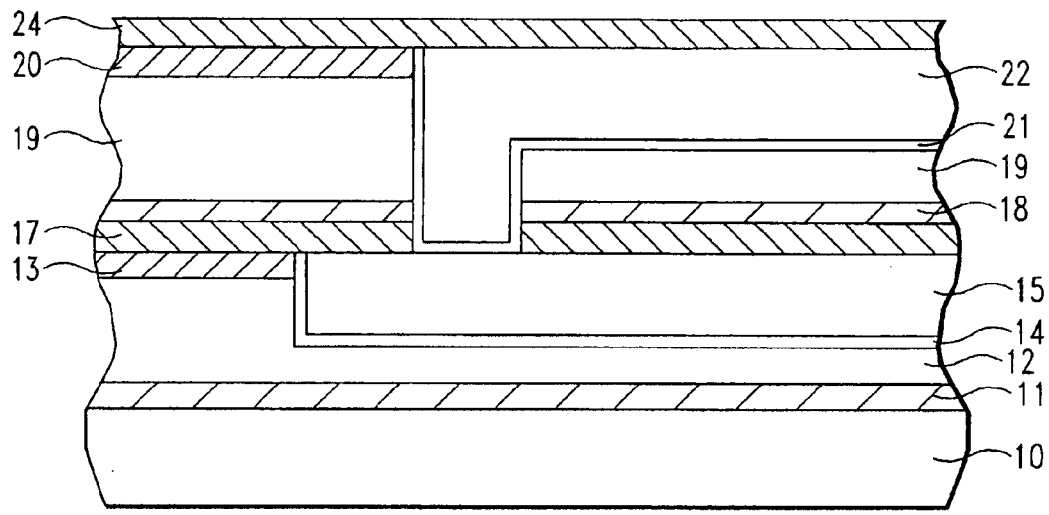
FIG. 1 is a schematic cross-sectional view of a partially-fabricated integrated circuit device illustrating a prior art interconnect structure.
Figure 2:
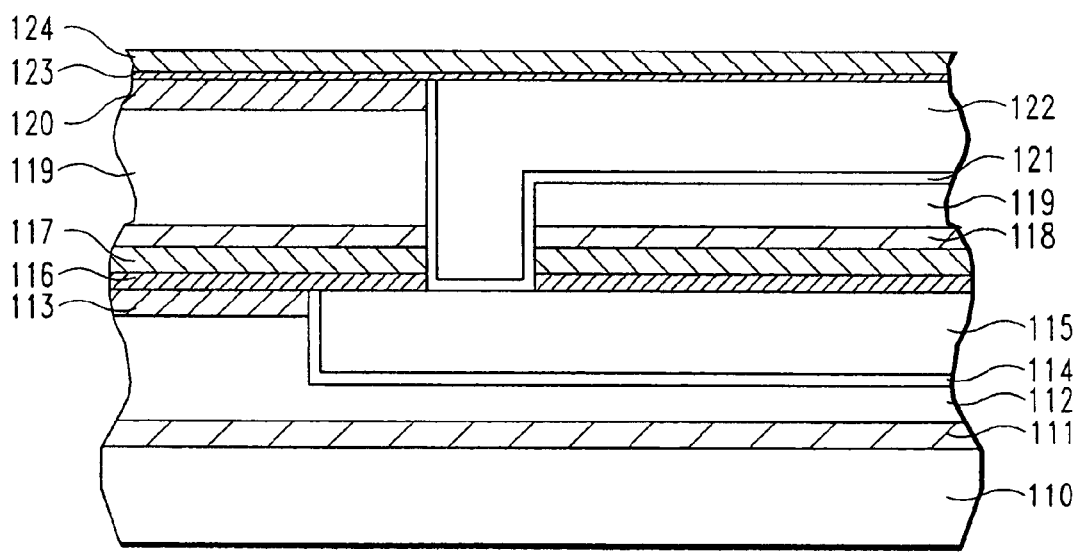
FIG. 2 is a schematic cross-sectional view of a partially-fabricated integrated circuit device illustrating an interconnect structure in accordance with a preferred embodiment of the invention.

Referring to FIG. 2, a preferred embodiment of the interconnect structure of this invention comprises a lower substrate 110 which may contain logic circuit elements such as transistors. A dielectric layer 112, commonly known as an inter-layer dielectric (ILD), overlies the substrate 110. An adhesion promoter layer 111 may be disposed between the substrate 110 and ILD layer 112. A hardmask layer 113 is preferably disposed on ILD layer 112. At least one conductor 115 is embedded in ILD layer 112 and hardmask layer 113. A diffusion barrier liner 114 may be disposed between ILD layer 112 and conductor 115. The top surface of conductor 115 is made coplanar with the top surface of hardmask layer 113, usually by a chemical-mechanical polish (CMP) step. An optional pre-clean layer 116 is disposed on the top surfaces of conductor 115 and hardmask layer 113. A cap layer 117 is disposed on pre-clean layer 116. If pre-clean layer 116 is absent, cap layer 117 is deposited on conductor 115 and hardmask layer 113.

A first interconnect level is defined by adhesion promoter layer 111, ILD layer 112, hardmask layer 113, diffusion barrier liner 114, conductor 115, optional pre-clean layer 116, and cap layer 117 in the interconnect structure shown in FIG. 2. A second interconnect level, shown above the first interconnect level in FIG. 2, includes adhesion promoter layer 118, ILD layer 119, hardmask layer 120, diffusion barrier liner 121, conductor 122, optional pre-clean layer 123 and cap layer 124.

ILD layers 112 and 119 may be formed of any suitable dielectric material, although low-k dielectric materials are preferred. Suitable dielectric materials include carbon-doped silicon dioxide materials; fluorinated silicate glass (FSG); organic polymeric thermoset materials, silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Novellus). An example of an HSQ material is FOx™ (available from Dow Corning). For this embodiment, preferred dielectric materials are organic polymeric thermoset materials, consisting essentially of carbon, oxygen and hydrogen. Preferred dielectric materials include the low-k polyarylene ether polymeric material known as SiLK™ (available from The Dow Chemical Company), and the low-k polymeric material known as FLARE™ (available from Honeywell). ILD layers 112 and 118 may each be about 100 nm to about 1000 nm thick, but these layers are each preferably about 600 nm thick. The dielectric constant for ILD layers 112 and 118 is preferably about 1.8 to about 3.5, and most preferably about 2.5 to about 2.9.

Alternatively, ILD layers 112 and 118 may be formed of a porous dielectric material, such as MesoELK™ (available from Air Products) and XLK™ (a porous version of FOx, available from Dow Corning). For example, If ILD layers 112 and 118 are formed of such porous dielectric material, the dielectric constant of these layers is preferably less than about 2.6, and is most preferably about 1.5 to 2.5. It is particularly preferred to use an organic polymeric thermoset material having a dielectric constant of about 1.8 to 2.2.

Adhesion promoter layers 111 and 118 are preferably about 9 nm thick, although thinner layers of about 0.5 nm to 9 nm thick may be used. These layers may be composed of any material suitable for enhancing adhesion of the dielectric material in ILD layers 112 and 119 to the underlying surfaces. For example, if SiLK is used for ILD layers 112 and 119, adhesion promoter layers 111 and 118 may be formed of an adhesion promoter known as AP4000 (also available from The Dow Chemical Company).

Hardmask layers 113 and 120 may be formed of any suitable dielectric material. In one preferred embodiment, hardmask layers 113 and 120 are formed of silicon nitride, and preferably have a composition of about 30 to 45 atomic % silicon, about 30 to 55 atomic % nitrogen, and about 10 to 25 atomic % hydrogen. Most preferably, these silicon nitride hardmask layers have a composition of about 41 atomic % silicon, about 41 atomic % nitrogen, and about 17.5 atomic % hydrogen. Alternatively, in another preferred embodiment, hardmask layers 113 and 120 are formed of silicon carbide, and preferably have a composition of about 24 to 29 atomic % silicon, about 33 to 39 atomic % carbon, and about 34 to 40 atomic % hydrogen, most preferably about 27 atomic % silicon, about 36 atomic % carbon and about 37 atomic % hydrogen.

Conductors 115 and 122 maybe formed of any suitable conductive material, such as copper or aluminum. Copper is particularly preferred as the conductive material, due to its relatively low resistance. Copper conductors 115 and 122 may contain small concentrations of other elements. Diffusion barrier liners 114 and 121 may comprise one or more of the following materials: tantalum, titanium, tungsten and the nitrides of these metals.

Optional pre-clean layers 116 and 123 may be formed of a material such as that described in U.S. Pat. No. 6,261,951. Specifically, these pre-clean layers maybe formed of a material comprising copper, silicon and oxygen, and optionally at least one of carbon, hydrogen, nitrogen and fluorine.

Cap layers 117 and 124 may be composed of silicon nitride, preferably having a composition of about 37 atomic % silicon, about 48 atomic % nitrogen, and about 15 atomic % hydrogen.

Figure 3A:
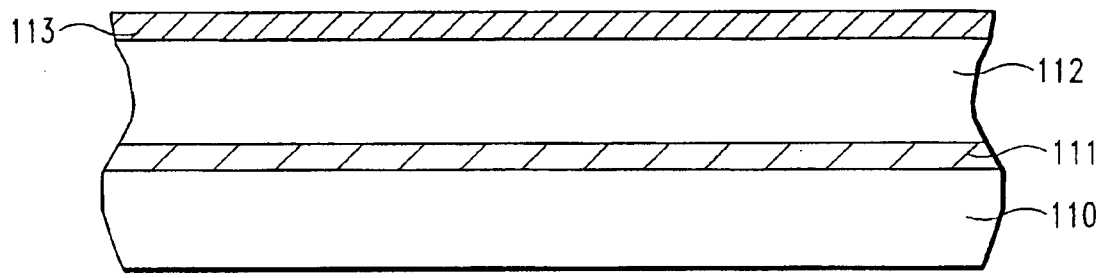
FIGS. 3(a)–3(j) illustrate a method for forming the interconnect structure of FIG. 2.

The interconnect structure of FIG. 2 may be formed by a damascene or dual damascene process, such as the process shown in FIGS. 3(a)–3(j). The process preferably begins with deposition of adhesion promoter layer 111 on substrate 110, and is followed by deposition of ILD layer 112 on adhesion promoter layer 111, as shown in FIG. 3(a). Adhesion promoter layer 111 and ILD layer 112 may be deposited by any suitable method. For example, if adhesion promoter layer 111 is formed of AP4000, the adhesion promoter solution may be applied by a spin-coating process, followed by a baking step. If SiLK™ is used for ILD layer 112, the resin may be applied by a spin-coating process, followed by a baking step to remove solvent and then a thermal curing step.

Hardmask layer 113 is then deposited on ILD layer 112, as shown in FIG. 3(a). Hardmask layer 113 may be deposited by any suitable method, but is preferably deposited by chemical vapor deposition (CVD) directly onto ILD layer 112. In one preferred embodiment, a silicon nitride hardmask layer 113 is deposited in a CVD reactor at a pressure in the range of about 0.1 to 10 torr, most preferably in the range of about 1 to 5 torr, using a combination of gases that may include, but are not limited to, silane ($SiH_4$), ammonia ($NH_3$), nitrogen ($N_2$) and helium (He). A typical deposition process uses a flow of $SiH_4$ in the range of about 100 to 700 sccm, a flow of $NH_3$ in the range of about 100 to 5000 sccm, and a flow of $N_2$ in the range of about 100 to 5000 sccm. The deposition temperature is typically within the range of about 150 to 500° C., most preferably in the range of about 350 to 450° C. The high-frequency radio-frequency (RF) power is typically in the range of about 50 to 700 watts per showerhead, and the low frequency RF power is typically in the range of about 50 to 500 watts per showerhead. The final deposition thickness is preferably in the range of about 10 to 100 nm, and most preferably in the range of about 25 to 70 nm. This silicon nitride hardmask film preferably has a composition of about 30 to 45 atomic % silicon, about 30 to 55 atomic % nitrogen, and about 10 to 25 atomic % hydrogen. Most preferably, this silicon nitride hardmask film has a composition of about 41 atomic % silicon, about 41 atomic % nitrogen, and about 17.5 atomic % hydrogen.

In another preferred embodiment, a silicon carbide hardmask layer 113 is deposited in a CVD reactor at a pressure of about 0.1 to 20 torr, most preferably in the range of about 1 to 10 torr, using a combination of gases that may include, but are not limited to, $SiH_4$, $NH_3$, $N_2$, He, trimethylsilane (3MS), and/or tetramethylsilane (4MS). A typical deposition process uses a flow of 3MS in the range of about 50 to 500 sccm and a flow of He in the range of about 50 to 2000 sccm. The deposition temperature is typically within the range of about 150 to 500° C., most preferably in the range of about 300 to 400° C. The RF power is typically in the range of about 150 to 700 watts per showerhead, most preferably in the range of about 100 to 500 watts per showerhead. The final deposition thickness is preferably in the range of about 10 to 100 nm, and most preferably in the range of about 25 to 70 nm. This amorphous hydrogenated silicon carbide hardmask film preferably has a composition of about 27 atomic % silicon, about 36 atomic % carbon and about 37 atomic % hydrogen.

Hardmask layer 113 may function as a patterning layer to assist in later etching of ILD layer 112 to form a trench for conductor 115. Hardmask layer 113 may also serve as a polish stop layer during a subsequent CMP step to remove excess metal.

Following deposition of a silicon nitride or silicon carbide hardmask film, as described above, additional sacrificial hardmask layers (not shown) may be deposited. For example, a series of hardmask layers may be deposited, such as the hardmask layers described in co-pending U.S. patent application Ser. No. 09/550,943, filed Apr. 14, 2000 and titled "Protective Hardmask for Producing Interconnect Structures," the disclosure of which is incorporated herein by reference. Alternatively, an additional silicon nitride film may be deposited, followed by a silicon oxide deposition. In one preferred embodiment, an additional silicon nitride hardmask film is deposited in a CVD reactor at a pressure in the range of about 0.1 to 10 torr, most preferably in the range of about 1 to 5 torr, using a combination of gases that may include, but are not limited to, $SiH_4$, $NH_3$, $N_2$ and/or He. A typical deposition process uses a flow of $SiH_4$ in the range of about 100 to 700 sccm, a flow of $NH_3$ in the range of about 100 to 5000 sccm, and a flow of $N_2$ in the range of about 100 to 5000 sccm. The deposition temperature is typically within the range of about 150 to 500° C., most preferably in the range of about 350 to 450° C. The high frequency RF power is typically in the range of about 50 to 700 watts per showerhead, and the low frequency RF power is typically in the range of about 50 to 500 watts per showerhead. The final deposition thickness is preferably in the range of about 10 to 100 nm, most preferably in the range of about 25 to 60 nm. This additional silicon nitride hardmask film preferably has a composition of about 41 atomic % silicon, about 41 atomic % nitrogen, and about 17.5 atomic % hydrogen.

The subsequent silicon oxide hardmask layer is deposited in a CVD reactor at a pressure in the range of about 0.1 to 10 torr, most preferably in the range of about 1 to 5 torr, using a combination of gases that may include, but are not limited to, $SiH_4$, $N_2O$, $N_2$, and $O_2$. A typical deposition uses a flow of $SiH_4$ in the range of about 10 to 700 sccm, a flow of $N_2O$ in the range of about 100 to 20000 sccm, and a flow of $N_2$ in the range of about 100 to 3000 sccm. The deposition temperature is typically in the range of about 150 to 500° C., most preferably in the range of about 350 to 450° C. RF power is typically in the range of about 150 to 500 watts per showerhead, most preferably in the range of about 50 to 3000 watts per showerhead. The final deposition thickness is preferably in the range of about 30 to 250 nm, most preferably in the range of about 50 to 200 nm. This additional silicon oxide hardmask layer preferably has a composition of about 33 atomic % silicon, about 63 atomic % oxygen, and less than about 1 atomic % hydrogen.

Figure 3B:
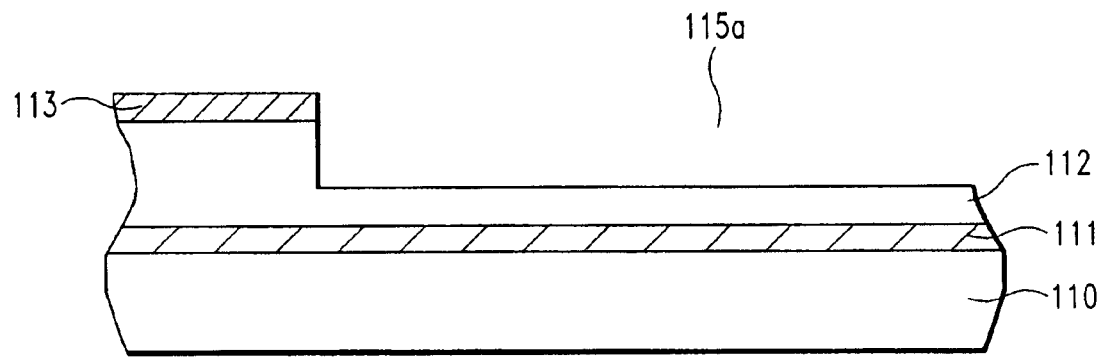
Figure 3C:
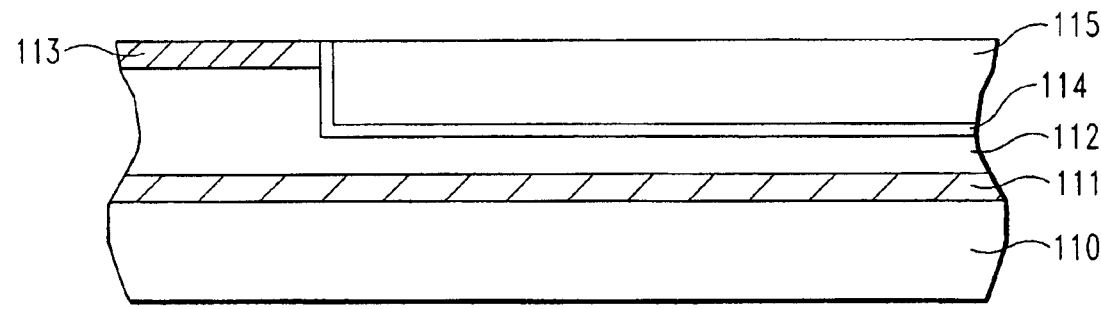

In FIG. 3(b), at least one trench 115a is formed using a conventional photolithography patterning and etching process. In a typical photolithography process, a photoresist material (not shown) is deposited on hardmask layer 113. The photolithography material is exposed to ultraviolet (UV) radiation through a mask, and then the photoresist material is developed. Depending on the type of photoresist material used, exposed portions of the photoresist may be rendered either soluble or insoluble during development. These soluble portions of the photoresist are then removed, leaving behind a photoresist pattern matching the desired pattern of trenches. Trench 115a is then formed by removing hardmask layer 113 and a portion of ILD layer 112 by, for example, reactive ion etching (RIE), in areas not protected by the photoresist. Hardmask layer 113 may assist in this etching step as follows. Hardmask layer 113 may be etched first in areas not covered by the photoresist, then the photoresist may be removed, leaving behind a patterned hardmask layer 113 matching the photoresist pattern. Then, ILD layer 112 may be etched in areas not covered by hardmask layer 113.

Following formation of trench 115a, the trench is preferably lined with diffusion barrier liner 114, and then a conductive material is deposited in trench 115a to form conductor 115. Diffusion barrier liner 114 may be deposited by any suitable method, such as by physical vapor deposition (PVD), chemical vapor deposition (CVD) or ionized physical vapor deposition (I-PVD). Diffusion barrier liner 114 may be a multi-layer liner constructed by depositing several refractory metals as a thin film composite. Conductive material 115 may be deposited in trench 115a by any suitable method, such as by plating technology. Excess liner 114 and conductive material 115 may be removed in a CMP process, in which the top surface of conductor 115 is made coplanar with the hardmask layer 113. Hardmask layer 113 may serve as a polish-stop layer during this CMP step, thereby protecting ILD layer 112 from damage during polishing. Sacrificial hardmask layers (not shown) may also be removed during this CMP step. However, it is important that the primary hardmask layer 113 remains continuous and of a sufficient thickness to provide protection to the underlying ILD during the following pre-clean step. It is preferred that a minimum thickness of about 100 Å of silicon carbide hardmask layer 113 remains, or a minimum thickness of about 25 Å of silicon nitride hardmask layer 113 remains. A remaining thickness of 500 Å is most preferred.

Figure 3D:
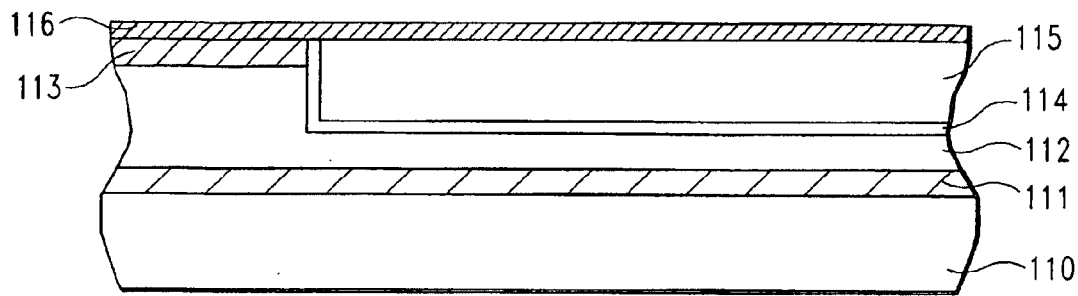

Next, a pre-clean or pre-activation step is performed and a pre-clean layer 116 is optionally deposited, as shown in FIG. 3(d). This pre-clean step may be performed in accordance with the method described in U.S. Pat. No. 6,261,951. In particular, the surface of conductor 115 is subjected to a reducing plasma including, but not limited to, $H_2$, $N_2$, $NH_3$ and/or noble gases. Of these reducing plasmas, $H_2$ and $NH_3$ are most preferred. This exposure step is carried out at a temperature in the range of about 20 to 600° C., for a time in the range of about 1 to about 3600 seconds. The exposure step is conducted at a pressure in the range of about 1 mTorr to about 20 Torr, RF power in the range of about 50 to about 10,000 watts, and a gas flow rate in the range of about 1 to about 10,000 sccm. In a most preferred embodiment, the pre-clean step is performed with a high frequency RF power in the range of about 150 to 450 watts, a low frequency RF power in the range of about 100 to 300 watts, and a flow rate of $NH_3$ at least about 1000, most preferably at least about 4000 sccm. A pre-clean layer 116 may be formed during this pre-clean step on the surface of copper conductor 115, where the layer comprises copper, silicon and oxygen, and optionally at least one of carbon, hydrogen, nitrogen and fluorine. This pre-clean layer typically has a thickness of less than about 10 nm.

Figure 3E:
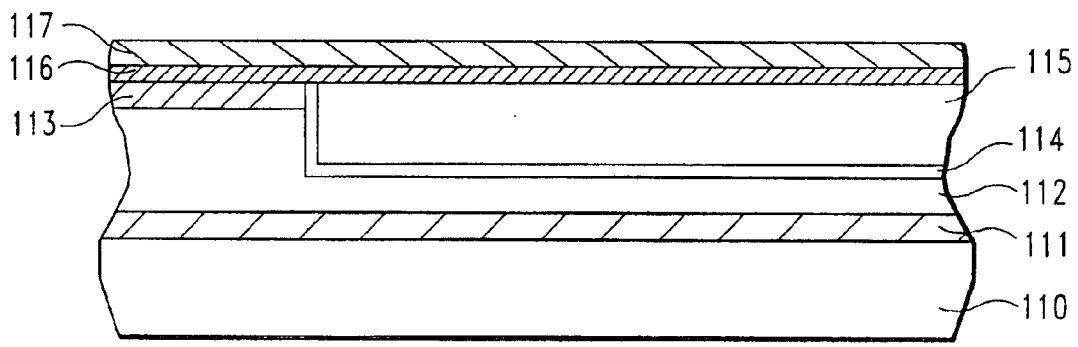

Following the pre-clean step of FIG. 3(d), and without interruption of the vacuum atmosphere imposed during the pre-clean step, cap layer 117 is next deposited on the partially fabricated interconnect structure, as shown in FIG. 3(e). Cap layer 117 should be deposited in the same PE CVD reaction chamber as was used for the pre-clean step, by effecting a gas exchange such that a PE CVD silicon nitride layer is deposited directly on the pre-cleaned surface of copper conductor 115 and hardmask layer 113. In a preferred embodiment, cap layer 113 is a silicon nitride film deposited in a CVD reactor at a pressure in the range of about 0.1 to 10 torr, most preferably in the range of about 1 to 7 torr, using a combination of gases that may include, but is not limited to, $SiH_4$, $NH_3$, $N_2$ and/or He. A typical deposition uses a flow of $SiH_4$ in the range of about 10 to 500 sccm, a flow of $NH_3$ in the range of about 100 to 3000 sccm, and a flow of $N_2$ in the range of about 500 to 25000 sccm. The deposition temperature is typically within the range about 150 to 500° C., most preferably in the range of about 350 and 450° C. The high frequency RF power is typically in the range of about 25 to 700 watts per showerhead, most preferably in the range of about 50 to 250 watts per showerhead. The low frequency RF power is typically in the range of about 0 to 500 watts per showerhead. The final deposition thickness is preferably in the range of about 10 to 100 nm, most preferably in the range of about 25 to 70 nm. Silicon nitride cap layer 117 preferably has a composition of about 37 atomic % silicon, about 48 atomic % nitrogen, and about 15 atomic % hydrogen.

Silicon nitride cap layer 117 may be deposited as a series of thin silicon nitride films, resulting in a total preferable thickness of about 10 to 100 nm, most preferably about 25 to 70 nm. In one embodiment, multiple pre-clean or pre-activation steps may be performed alternatively with multiple thin silicon nitride film depositions. In other words, a first pre-clean step may be performed, then a first thin silicon nitride film may be deposited, then a second pre-clean step may be performed, then a second thin silicon nitride film may be deposited, and so forth until a total thickness of about 10 to 100 nm is achieved. However, cap layer 117 is most preferably deposited following a single pre-clean step. In other words, a single pre-clean step is preferably performed, and then a series of thin silicon nitride films is preferably deposited in a clustered arrangement, without any intermediate pre-clean steps.

Figure 3F:
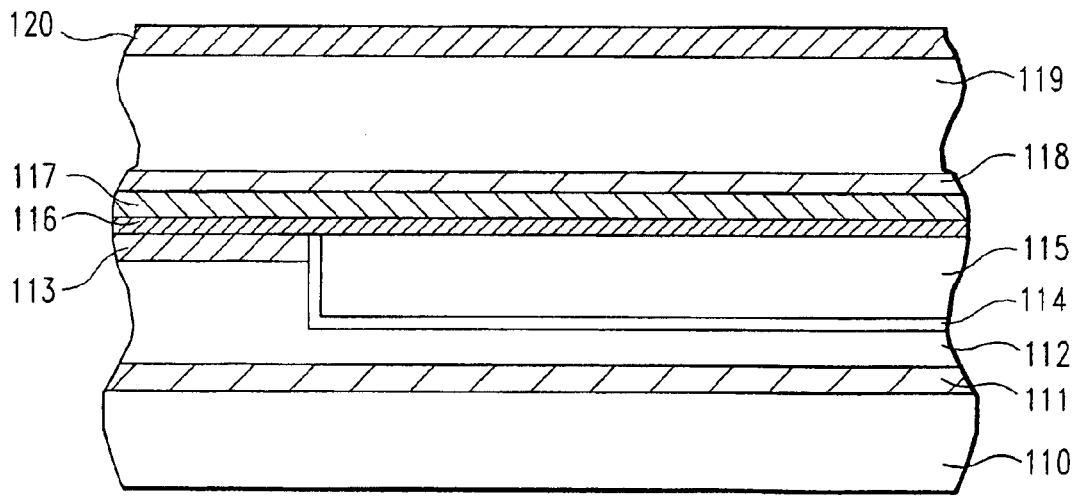

FIGS. 3(a)–3(e) illustrate the formation of the first interconnect level, which consists of adhesion promoter layer 111, ILD layer 112, hardmask layer 113, diffusion barrier liner 114, conductor 115, cap layer 117, and optional pre-clean layer 116. In FIG. 3(f), the formation of the second interconnect level begins with deposition of adhesion promoter layer 118, ILD layer 119 and hardmask layer 120. Adhesion promoter layer 118 may be deposited using the same method as that for adhesion promoter layer 111. Likewise, ILD layer 119 may be deposited using the same method as that for ILD layer 112, and hardmask layer 120 may be deposited using the same method as that for hardmask layer 113. Additional sacrificial hardmask layers (not shown) may be deposited on primary hardmask layer 120.

Figure 3G:
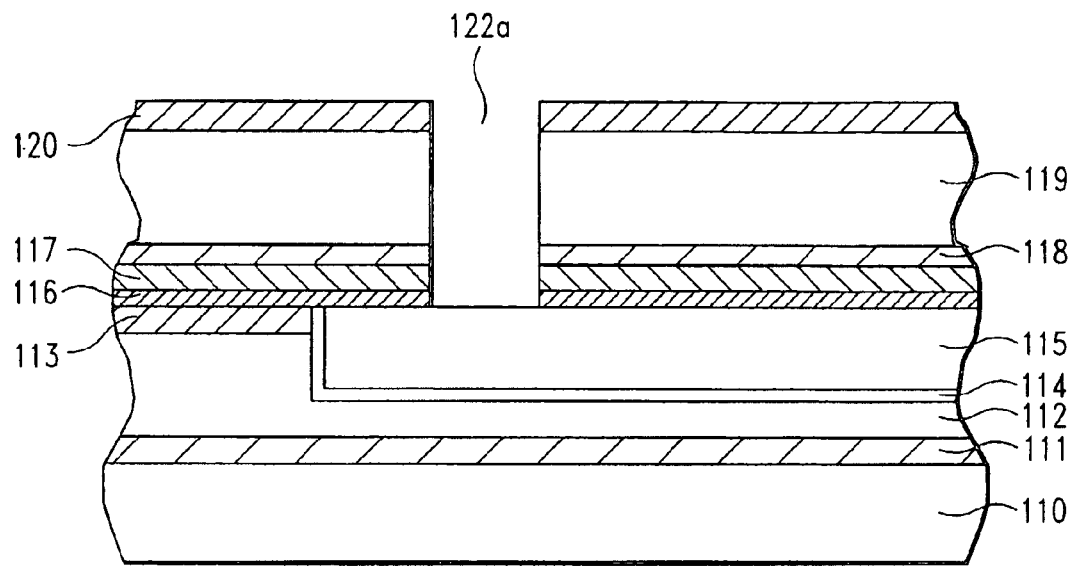
Figure 3H:
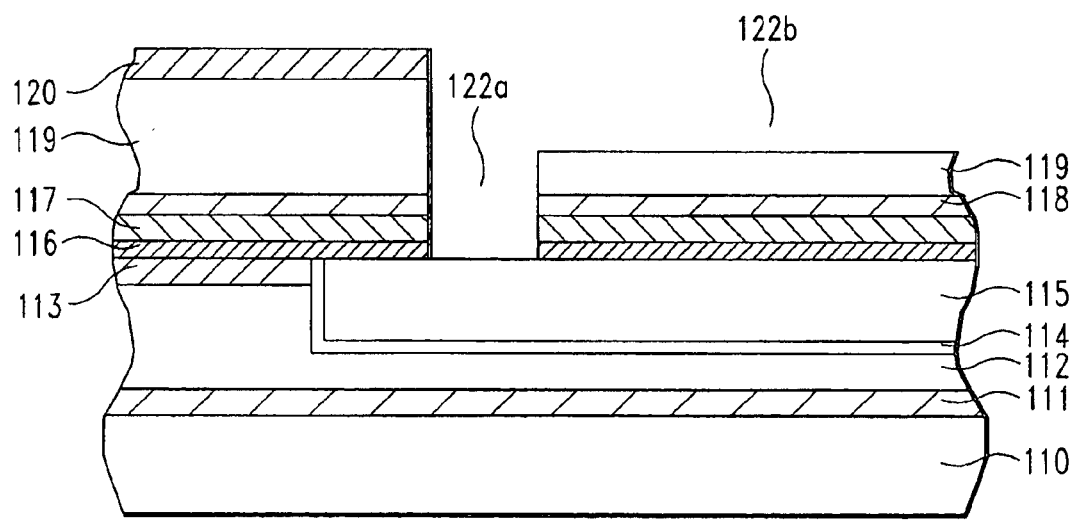

FIGS. 3(g) and 3(h) illustrate the formation of via 122a and trench 122b. First, at least one via 122a may be formed in hardmask layer 120, ILD layer 119, adhesion promoter layer 118, cap layer 117 and optional pre-clean layer 116, using a conventional photolithography patterning and etching process, as shown in FIG. 3(g). Then, at least one trench 122b may be formed in hardmask layer 120 and a portion of ILD layer 119, using a conventional photolithography process, as shown in FIG. 3(h). Via 122a and trench 122b maybe formed using the same photolithography process as that used to form trench 115a.

Alternatively, via 122a and trench 122b may be formed by first patterning and etching a trench in hardmask layer 120 and ILD layer 119, where the trench has a depth equal to the depth of trench 122b, but has a length equal to the length of trench 122b and the width of via 122a combined. Via 122a may then be formed by etching through the remainder of ILD layer 119, adhesion promoter layer 118, cap layer 117 and optional pre-clean layer 116.

Figure 3I:
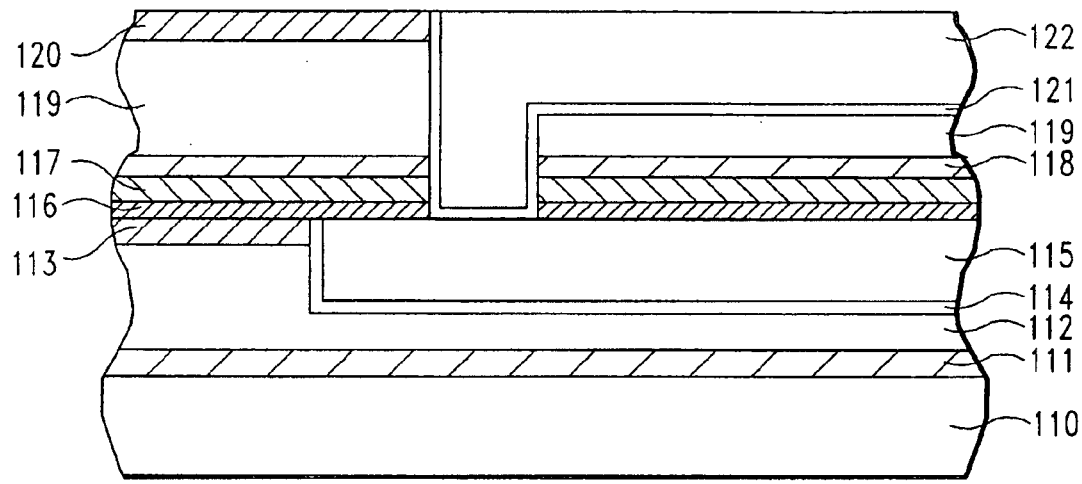

Following formation of via 122a and trench 122b, the via and trench are preferably lined with diffusion barrier liner 121, and then a conductive material is deposited in the via and trench to form conductor 122, as shown in FIG. 3(i). Diffusion barrier liner 121 may be deposited by the same method used for diffusion barrier liner 114, and conductive material 122 may deposited by the same method used for conductor 115. Excess liner 121 and conductive material 122 may be removed in a CMP process, in which the top surface of conductor 122 is made coplanar with the hardmask layer 120. Any sacrificial hardmask layers (not shown) also may be removed during this CMP step. Hardmask layer 120 may serve as a polish-stop layer during this CMP step, thereby protecting ILD layer 119 from damage during polishing. Again, it is important that hardmask layer 120 remain continuous after the CMP step. Hardmask layer 120 should have a final minimum thickness similar to that of hardmask layer 113.

Next, a pre-clean step is performed, and optional pre-clean layer 123 is formed, as shown in FIG. 3(i). The pre-clean step may be performed in the same manner as described above in connection with FIG. 3(d), and pre-clean layer 123 may be formed using the same methods described for pre-clean layer 116.

Figure 3J:
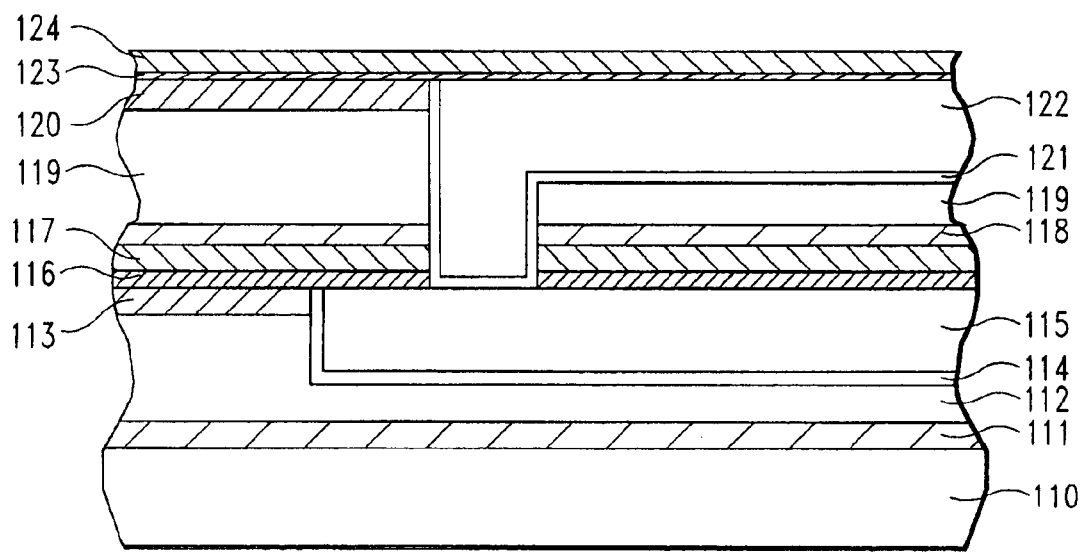

Cap layer 124 is then deposited on the interconnect structure, as shown in FIG. 3(j). Cap layer 124 may be deposited using the same PE CVD process as that for cap layer 117.

EXAMPLE 1

A series of semiconductor wafers containing partially fabricated interconnect structures were prepared, each comprising a plurality of copper conductors embedded in SiLK™ low-k dielectric material. The wafers each had been planarized in a CMP step such that the top surface of the copper conductors was made coplanar with the surface of a hardmask layer overlying the low-k dielectric material. Each wafer was subjected to a different pre-clean step, in which the high frequency RF power, low frequency RF power, flow rate of $NH_3$, and flow rate of $N_2$ were varied. The time of exposure during each pre-clean step was 18 seconds. The high frequency RF power (HF RF), low frequency RF power (LF RF), $NH_3$ flow rate and $N_2$ flow rate for each pre-clean step are listed in Table 1.

TABLE 1

| | Pre-clean Exposure Variables | | | | |
|---|---|---|---|---|---|
| Wafer | HF RF (W) | LF RF (W) | $NH_3$ (sccm) | $N_2$ (sccm) | Adhesion |
| 1 | 350 | 100 | 4000 | 0 | 30.0 |
| 2 | 90 | 450 | 2700 | 800 | 11.3 |
| 3 | 250 | 300 | 1200 | 1000 | 17.5 |
| 4 | 250 | 300 | 1200 | 0 | 16.6 |
| 5 | 165 | 300 | 1200 | 1000 | 11.0 |
| 6 | 165 | 500 | 1200 | 1000 | 10.2 |
| 7 | 115 | 300 | 1200 | 1000 | 11.0 |
| 8 | 350 | 300 | 4000 | 0 | 26.8 |
| 9 | 450 | 100 | 4000 | 0 | 27.3 |
| 10 | 350 | 100 | 2700 | 0 | 29.0 |
| 11 | 350 | 100 | 8000 | 0 | >30 |

Following pre-clean, a silicon nitride cap layer was deposited on each wafer. Each silicon nitride cap layer was deposited using the same deposition parameters for each wafer. The relative adhesion for each silicon nitride cap layer was then measured using a four-point bend adhesion test. The adhesion values for each wafer (expressed as Joules/$m^2$) are listed in Table 1.

The adhesion values for wafers 1 and 11 are highest (at least about 30 Joules/$m^2$), and the adhesion values for wafers 8, 9 and 10 are also relatively high. In other words, the pre-clean parameters used for wafers 1 and 11 resulted in the highest adhesion of the silicon nitride cap layer to the copper conductors, and the pre-clean parameters used for wafers 8, 9 and 10 resulted in relatively high adhesion of the silicon nitride cap layer to the copper conductors. For each of wafers 1, 8, 9 and 11, the flow rate of $NH_3$ was 4000 sccm or higher. Moreover, for each of wafers 1, 8, 9, 10 and 11, the HF RF was 350 watts or higher.

EXAMPLE 2

Two semiconductor wafers containing partially fabricated interconnect structures were prepared, each comprising a plurality of copper conductors embedded in SiLK™ low-k dielectric material. The wafers each had been planarized in a CMP step such that the top surface of the copper conductors was made coplanar with the surface of a hardmask layer overlying the low-k dielectric material.

Each wafer was subjected to a different pre-clean step, in which the high frequency RF power, low frequency RF power, and flow rate of $NH_3$ were kept constant, but the sequence of pre-clean and deposition steps was varied. For each wafer, the high frequency RF power was 350 watts, the low frequency RF power was 100 watts, and the flow rate of $NH_3$ was 4000 sccm. The pre-clean exposure time for each wafer was 18 seconds. Following pre-clean, a silicon nitride cap layer was deposited on each wafer. For the first wafer, a single pre-clean step was performed, and then the silicon nitride cap layer was deposited as a series of thin silicon nitride layers in a clustered arrangement, resulting in a final silicon nitride thickness of 358.37 Å. For the second wafer, an initial pre-clean step was performed, and then a series of steps followed, each of which included another pre-clean and a thin silicon nitride deposition. Thus, for the second wafer, a first pre-clean layer was deposited, then a second pre-clean layer was deposited, then a first thin silicon nitride layer was deposited, then a third pre-clean layer was deposited, then a second thin silicon nitride layer was deposited, and so forth, until a final pre-clean and silicon nitride thickness of 335.46 Å was reached.

After deposition of the silicon nitride cap layers, the relative adhesion for each silicon nitride cap layer was measured using the four-point bend adhesion test. The first wafer exhibited an adhesion of 30.8 Joules/m$^2$, whereas the second wafer exhibited an adhesion of only 11.8 Joules/m$^2$. Thus, the wafer which was subjected to a single pre-clean step prior to silicon nitride deposition, and no intermediate pre-clean steps between subsequent deposition of thin silicon nitride films, exhibited the highest adhesion of the cap layer to the underlying copper conductor.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. An interconnect structure formed on a substrate, the structure comprising:
   a dielectric layer overlying the substrate, said dielectric layer being fanned of a carbon-containing dielectric material having a dielectric constant of less than about 4;
   a continuous hardmask layer on said dielectric layer, said hardmask layer having a top surface;
   at least one conductor embedded in said dielectric layer and having a surface coplanar with the top surface of said hardmask layer;
   a cap layer on said at least one conductor and on said hardmask layer, said cap layer having a bottom surface in strong adhesive contact with said conductor, wherein said cap layer is formed of silicon nitride by a plasma-enhanced chemical vapor deposition (PE CVD) process; and
   a pre-clean layer disposed beneath said cap layer and on said at least one conductor and said hardmask layer, said pre-clean layer or being formed of a material comprising copper, silicon and oxygen.

2. The interconnect structure according to claim 1, further comprising a conductive liner disposed between said conductor and said dielectric layer.

3. The interconnect structure according to claim 1, further comprising an adhesion promoter layer disposed between said dielectric layer and the substrate.

4. The interconnect structure according to claim 1, wherein said dielectric layer is formed of an organic thermoset polymer having a dielectric constant of about 1.8 to about 3.5.

5. The interconnect structure according to claim 4, wherein said dielectric layer is formed of a polyarylene ether polymer.

6. The interconnect structure according to claim 1, wherein said hardmask layer is formed of silicon nitride.

7. The interconnect structure according to claim 6, wherein said hardmask layer has a thickness of at least about 25 angstroms.

8. The interconnect structure according to claim 1, wherein said hardmask layer is formed of silicon carbide.

9. The interconnect structure according to claim 8, wherein said hardmask layer has a thickness of at least about 100 angstroms.

10. The interconnect structure according to claim 1, wherein said conductor is formed of copper.

11. The interconnect structure according to claim 1, wherein said hardmask layer has a thickness of at feast about 500 angstroms.

12. The interconnect structure according to claim 1, wherein said cap layer has a thickness of about 5 to about 120 nm.

13. The interconnect structure according to claim 1, wherein said cap layer has a composition of about 30 to 45 atomic % silicon, about 30 to 55 atomic % nitrogen, and about 10 to 25 atomic % hydrogen.

* * * * *